United States Patent
Celedon et al.

(10) Patent No.: US 11,863,145 B1
(45) Date of Patent: Jan. 2, 2024

(54) AUTOMATIC GAIN CONTROL (AGC) USING A WIDEBAND RF TUNER IN RF AMPLIFIERS IN A HYBRID FIBER-COAXIAL (HFC) NETWORK

(71) Applicant: Applied Optoelectronics, Inc., Sugar Land, TX (US)

(72) Inventors: Rafael Celedon, Atlanta, GA (US); Steven Blashewski, Duluth, GA (US); Mark Siejka, Winder, GA (US); David Stewart, Lilburn, GA (US); Stéphane Chapeau, Duluth, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 17/945,600

(22) Filed: Sep. 15, 2022

(51) Int. Cl.
*H03G 3/30* (2006.01)
*H04B 17/21* (2015.01)
*H04B 10/2575* (2013.01)

(52) U.S. Cl.
CPC .......... *H03G 3/3068* (2013.01); *H04B 17/21* (2015.01); *H04B 10/25751* (2013.01)

(58) Field of Classification Search
CPC . H03G 3/3068; H04B 17/21; H04B 10/25751
See application file for complete search history.

(56) References Cited

U.S. PATENT DOCUMENTS

| | | | |
|---|---|---|---|
| 6,769,133 B1 | 7/2004 | Blashewski et al. | |
| 10,044,441 B2 | 8/2018 | Jones et al. | |
| 2015/0148092 A1* | 5/2015 | Kim | H04W 52/226 |
| | | | 455/522 |
| 2017/0077886 A1* | 3/2017 | Alavi | H03F 3/189 |

* cited by examiner

*Primary Examiner* — Sung S Ahn
(74) *Attorney, Agent, or Firm* — Grossman Tucker Perreault & Pfleger, PLLC; Norman S. Kinsella

(57) ABSTRACT

Automatic gain control (AGC) may be accomplished in a radio frequency (RF) amplifier in a hybrid fiber-coaxial (HFC) network using a wideband RF tuner to select multiple pilot channels (e.g., frequencies in lower and upper portions of an RF signals spectrum) for use in measuring power and determining a correction to be applied to the RF amplifier. The power of the pilot channel or channels may be measured, for example, using a received signal strength indicator (RSSI) from the wideband RF tuner or using a power detector circuit. Using the wideband RF tuner allows selectable gain and/or tilt control across a wideband spectrum, such as a channel spectrum of a CATV downstream RF signal, to maintain stable RF output levels of the amplifier as RF input levels vary. The RF amplifier may be a line extender amplifier used in a CATV HFC network to amplify a wideband RF spectrum of up to 1.8 GHz.

25 Claims, 7 Drawing Sheets

AUTOMATIC GAIN CONTROL (AGC) USING A WIDEBAND RF TUNER IN RF AMPLIFIERS IN A HYBRID FIBER-COAXIAL (HFC) NETWORK

TECHNICAL FIELD

The present disclosure relates to radio frequency (RF) amplifiers and more particularly, to automatic gain control using a wideband RF tuner in an RF amplifier in an HFC network, such as a CATV network.

BACKGROUND INFORMATION

RF amplifiers are used to amplify RF signals in communication systems, such as a CATV system that provides both downstream (forward) signals to subscriber locations and upstream (reverse) signals from subscriber locations. In a hybrid fiber-coaxial (HFC) network providing CATV services, optical communication is provided over optical fibers between a headend/hub and an optical node and electrical RF communication is provided over coaxial cables between the optical node and the subscriber locations. In such HFC networks, RF amplifiers are used after the optical node to extend the transmission distance of the RF signals and thus extend the reach of the CATV services provided to subscriber locations.

Cable TV companies increase the capacity of their network (either adding more television channels or more internet bandwidth capability) by increasing the frequency range of the RF network. When the RF cable plant frequency range is extended to higher frequencies, the cable loss increases. As a result, the gain or output level of the RF amplifier is required to increase in order to maintain the desired signal levels in the network. One of the challenges faced by expanding data and communications networks is updating the RF amplifiers to operate at the higher frequency range with the increased gain/output level without requiring significant changes to the HFC network infrastructure (e.g., moving the RF amplifiers closer together in the HFC network). In addition to providing the desired gain, RF amplifiers should account for changes in frequency tilt of the network, which may be significant given the non-linear nature of the response of coaxial cable at higher frequencies. In higher bandwidth RF amplifiers designed to meet the demands of higher bandwidth CATV/HFC networks, maintaining stable RF output levels of the amplifier at higher frequencies over a broader RF spectrum is particularly challenging as input levels vary due to temperature induced changes.

SUMMARY

Consistent with an embodiment, a controlled radio frequency (RF) amplifier for use in a hybrid fiber-coaxial (HFC) network is provided. The controlled RF amplifier includes amplifier circuitry configured to receive an input downstream RF signal having a wideband spectrum and to amplify the input downstream RF signal to provide an output downstream RF signal having the wideband spectrum. The controlled RF amplifier also includes automatic gain control (AGC) circuitry configured to control the gain of the amplifier circuitry. The AGC circuitry includes a wideband RF tuner configured to receive a sample of the downstream RF signal from the amplifier circuitry and to select at least first and second pilot channels from the downstream RF signal. The sample of the downstream RF signal may be taken at the input, immediate stage, output, or any other location within the controlled RF amplifier. The AGC circuitry also includes a power detector circuit or an RSSI signal monitoring circuit for measuring power of the at least first and second pilot channels and a controller configured to determine a correction based on the measured power of the at least first and second pilot channels and to provide a control voltage or voltages to the amplifier circuitry based on the correction.

Consistent with another embodiment, an automatic gain control (AGC) system is provided for controlling gain in an RF line extender amplifier in a hybrid fiber-coaxial (HFC) network. The AGC system includes a wideband RF tuner configured to receive a sample of a downstream RF signal from the RF amplifier and to select at least first and second pilot channels from the downstream RF signal. The downstream RF signal has a wideband spectrum of up to 1.8 GHz, wherein the first channel is located in a lower frequency range of the wideband spectrum and the second channel is located in an upper frequency range of the wideband spectrum. The AGC system also includes a power detector circuit for measuring power of the selected at least first and second pilot channels and a controller configured to determine a correction based on the measured power of the at least first and second pilot channels and to provide a control voltage to RF amplifier based on the correction for automatic gain control.

Consistent with a further embodiment, a method is provided for providing automatic gain control (AGC) of a radio frequency (RF) amplifier in a hybrid fiber-coaxial (HFC) network. The method includes: receiving an input downstream RF signal having a wideband RF spectrum in the RF amplifier; amplifying the input downstream RF signal using RF amplifier circuitry to produce an output downstream RF signal having the wideband RF spectrum; selecting at least first and second pilot channels in the downstream RF signal having the wideband spectrum, wherein selecting the pilot channels is performed using a wideband RF tuner; measuring power of the at least first and second pilot channels; determining a correction based, at least in part, on the measured power of the first and second pilot channels; and sending a control voltage to the RF amplifier circuitry based on the correction.

BRIEF DESCRIPTION OF THE DRAWINGS

These and other features and advantages will be better understood by reading the following detailed description, taken together with the drawings wherein.

DETAILED DESCRIPTION

Figure 1:
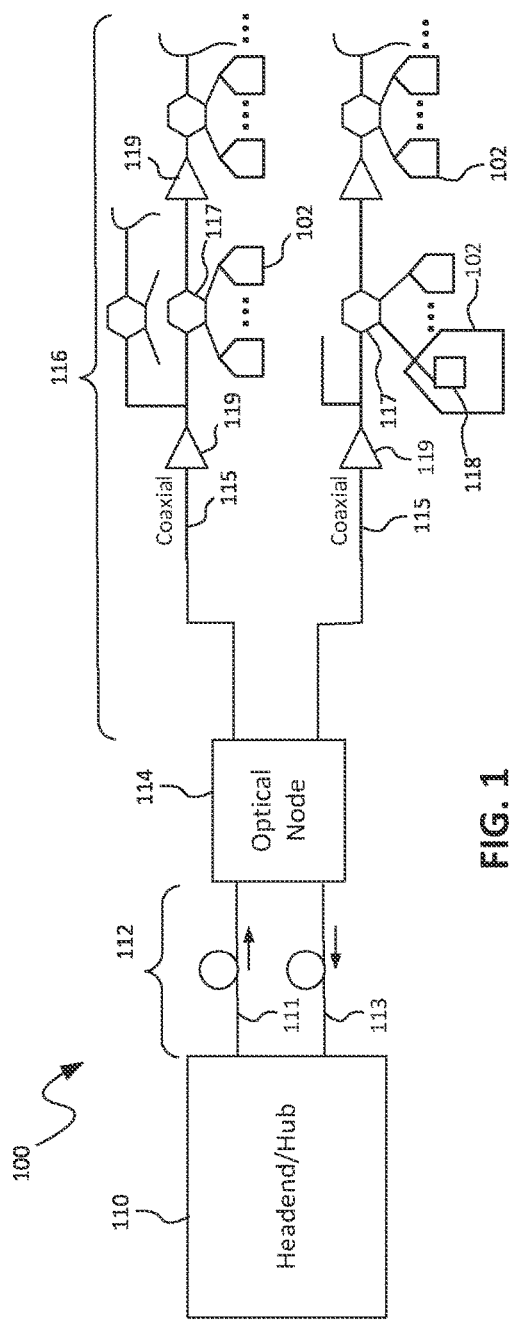
FIG. 1 is a schematic diagram of a CATV network including a radio frequency (RF) line extender amplifier with an automatic gain control (AGC) system using a wideband RF tuner to select multiple pilot channels for AGC, consistent with embodiments of the present disclosure.

Automatic gain control (AGC) may be accomplished in a radio frequency (RF) amplifier in a hybrid fiber-coaxial (HFC) network, consistent with embodiments of the present disclosure, using a wideband RF tuner to select multiple pilot channels (e.g., frequencies in lower and upper portions of an RF signal spectrum) for use in measuring power and determining a correction to be applied to the RF amplifier. The power may be measured, for example, using a received signal strength indicator (RSSI) from the wideband RF tuner or using a power detector circuit after the wideband RF tuner. Using the wideband RF tuner allows selectable gain and/or tilt control across a wideband spectrum, such as a channel spectrum of a CATV downstream RF signal, to maintain stable RF output levels as the RF amplifier performance or input level varies due to, for example, higher frequency operation or temperature induced changes. In the illustrated embodiments described herein, the RF amplifier is a line extender amplifier used in a CATV HFC network to amplify a wideband RF spectrum of up to 1.8 GHz; however, the AGC systems and methods using a wideband RF tuner described herein may be used in other types of RF amplifiers in HFC networks and at other frequency ranges.

As used herein, "channel" refers to a sub-range of frequencies within a spectrum of frequencies, which are capable of being modulated to carry information. A "channel" may be identified as a single frequency in the sub-range of frequencies, and as used herein, "selecting a channel" may include selecting a single frequency that identifies the channel. As used herein, a "downstream RF signal" (also referred to as a forward RF signal) is an RF signal being sent from a source, such as a CATV headend/hub, to a destination, such as a CATV subscriber. As used herein, "composite power" refers to the total power of multiple frequencies from an RF signal. As used herein, "channel spectrum" refers to a predefined range of radio frequencies divided into a plurality of sub-ranges of frequencies (referred to as physical channels) and capable of being modulated to carry information. A "CATV channel spectrum" is a channel spectrum used for delivering video and/or data in a CATV network and is not limited to a particular range of frequencies.

As used herein, "module" is a structural term referring to a self-contained assembly of components (e.g., electronic, optical or opto-electronic components) that together perform a dedicated function. The "modules" discussed herein (e.g., optical receiver module and RF amplifier module) are used as the names for structure and thus the term "module" is not being used as a nonce word in the present application. As used herein, the terms "circuit" and "circuitry" refer to physical electronic components (i.e., hardware) and any software and/or firmware (i.e., code), which may configure the hardware, be executed by the hardware, and/or otherwise be associated with the hardware. A particular processor and memory, for example, may comprise a first "circuit" when executing a first portion of code to perform a first function and may comprise a second "circuit" when executing a second portion of code to perform a second function. As used herein, the term "coupled" refers to any connection, coupling, link or the like between elements. Such "coupled" elements are not necessarily directly connected to one another and may be separated by intermediate components.

Referring to FIG. 1, an example of a CATV network 100 implementing automatic gain control (AGC) using a wideband RF tuner, consistent with embodiments of the present disclosure, is described in greater detail. The system and method for AGC using a wideband RF tuner may be implemented, for example, in line extender RF amplifiers 119 in the CATV network 100, as described in greater detail below. In general, the CATV network 100 is a hybrid fiber-coaxial (HFC) network capable of delivering both cable television programming (i.e., video) and IP data services (e.g., internet and voice over IP) to customers or subscribers 102 through the same fiber optic cables and coaxial cables (i.e., trunk lines). Such a CATV network 100 is commonly used by service providers, such as Comcast Corporation, to provide combined video, voice and broadband internet services to the subscribers 102. Although example embodiments of CATV networks are described herein based on various standards (e.g., Data over Cable Service Interface Specification or DOCSIS), the concepts described herein may be applicable to other embodiments of CATV networks using other standards.

Multiple cable television channels and IP data services (e.g., broadband internet and voice over IP) may be delivered together simultaneously in the CATV network 100 by transmitting signals using frequency division multiplexing over a plurality of physical channels across a CATV channel spectrum. One example of the CATV downstream channel spectrum (also referred to as forward spectrum) includes channels from 650 MHz to 1794 MHz, but the CATV channel spectrum may be expanded even further to increase bandwidth for data transmission. In a CATV channel spectrum, some of the physical channels may be allocated for cable television channels and other physical channels may be allocated for IP data services. Other channel spectrums and bandwidths may also be used and are within the scope of the present disclosure.

In addition to the signals being carried downstream (also referred to as forward signals) to deliver the video and IP data to the subscribers 102, the CATV network 100 may also carry signals (e.g., IP data or control signals) upstream from the subscribers (also referred to as reverse signals), thereby providing bi-directional communication over the trunks. According to one example, the signal spectrum for the reverse signals carried upstream may be up to 600 MHz.

The CATV network 100 generally includes a headend/hub 110 connected via optical fiber trunk lines 112 to one or more optical nodes 114, which are connected via a coaxial cable distribution network 116 to customer premises equipment (CPE) 118 at subscriber locations 102. The headend/hub 110 receives, processes and combines the content (e.g., broadcast video, narrowcast video, and internet data) to be carried over the optical fiber trunk lines 112 as optical signals. The optical fiber trunk lines 112 include forward path optical fibers 111 for carrying downstream optical signals from the headend/hub 110 and return or reverse path optical fibers 113 for carrying upstream optical signals to the headend/hub 110. The optical nodes 114 provide an optical-to-electrical interface between the optical fiber trunk lines 112 and the coaxial cable distribution network 116. The optical nodes 114 thus receive downstream optical signals and transmit upstream optical signals and transmit downstream (forward) RF electrical signals and receive upstream (reverse) RF electrical signals.

The cable distribution network 116 includes coaxial cables 115 including trunk coaxial cables connected to the optical nodes 114 and feeder coaxial cables connected to the trunk coaxial cables. Subscriber drop coaxial cables are connected to the distribution coaxial cables using taps 117 and are connected to customer premises equipment 118 at the subscriber locations 102. The customer premises equipment 118 may include set-top boxes for video and cable modems for data. One or more line extender RF amplifiers 119 may also be coupled to the coaxial cables 116 for amplifying the forward signals (e.g., CATV signals) being carried downstream to the subscribers 102 and for amplifying the reverse signals being carried upstream from the subscribers 102. In this embodiment, the line extender RF amplifiers 119 may include an automatic gain control (AGC) system using a wideband RF tuner, as described herein, for controlling the gain of at least the downstream or forward RF signals. In other embodiments, the system and method for AGC using a wideband RF tuner may be used in other RF amplifiers.

Figure 2:
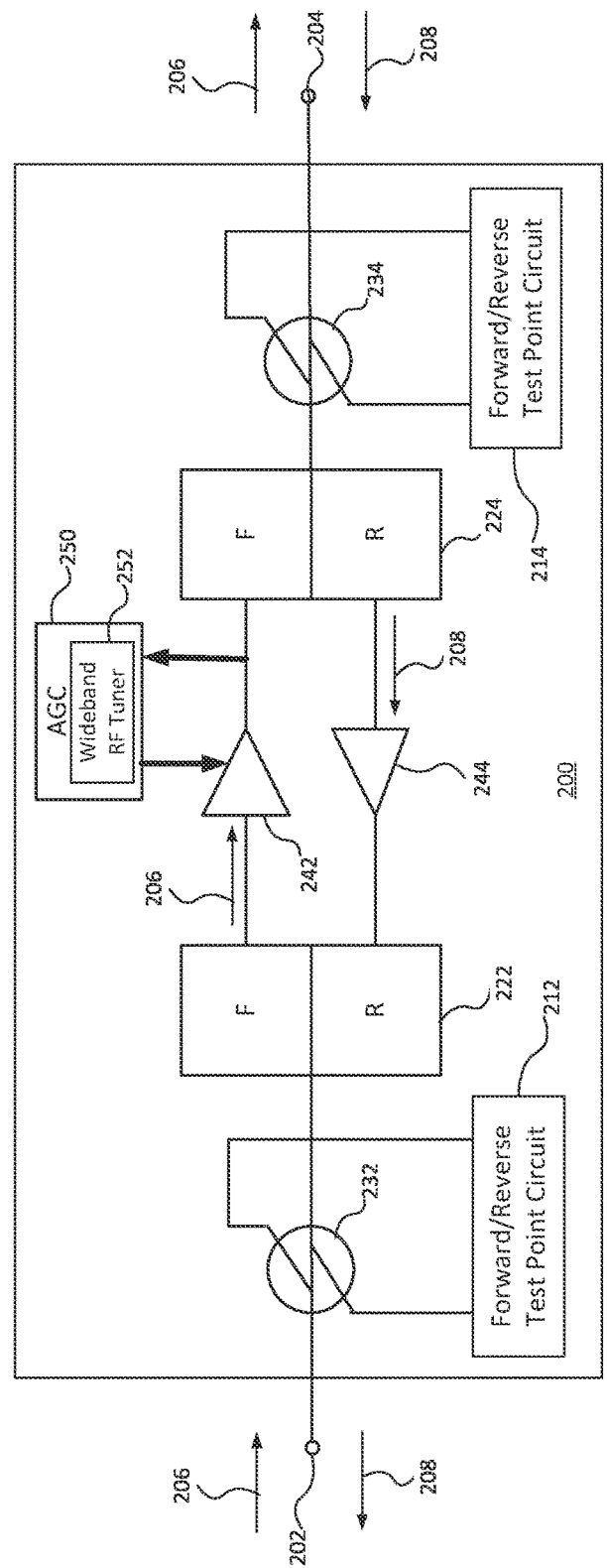
FIG. 2 is a schematic diagram of an RF amplifier including an AGC system for controlling gain of a downstream or forward RF signal based on pilot channels selected by a wideband RF tuner, consistent with embodiments of the present disclosure.

Referring to FIG. 2, an RF amplifier 200 including automatic gain control (AGC) using a wideband RF tuner to select pilot channels, is shown and described in greater detail. In one example, the controlled RF amplifier 200 may be a line extender amplifier that supports DOCSIS 4.0 FDD (frequency division duplex) capabilities with downstream operation at frequencies up to 1794 MHz and upstream operation at frequencies up to 684 MHz. FDD refers to bi-directional broadband RF communication where the downstream and upstream each have their own dedicated, non-overlapping frequency spectrums. The RF amplifier 200 may be a line extender RF amplifier such as the line extender RF amplifier 119 used in the CATV network 100 described above.

The RF amplifier 200 includes at least first and second ports 202, 204 configured to be coupled to an electrical path carrying forward and reverse RF signals 206, 208, such as the coaxial cable 115 carrying forward RF signals downstream and carrying reverse RF signals upstream in the CATV network 100. The RF amplifier 200 may be located inside an amplifier housing 201, such as a weatherproof housing configured for an outdoor environment, with the ports 202, 204 located on the outside of the amplifier housing 201. The first port 202 provides an input for forward signals 206 and an output for reverse signals 208, and the second port 204 provides an input for reverse signals 208 and an output for forward signals 206. The RF amplifier 200 may include forward and reverse test point circuits 212, 214 coupled to the respective ports 202, 204 via respective directional couplers 232, 234. The forward and reverse test point circuits 212, 214 allow testing of the forward and reverse signals 206, 208 before and after amplification, for example, as described in U.S. Pat. No. 6,769,133, which is fully incorporated herein by reference.

The RF amplifier 200 further includes a first diplex filter 222 coupled to the port 202, a second diplex filter 224 coupled to the port 204, and forward and reverse gain stages 242, 244 coupled between the diplex filters 222, 224. The diplex filters 222, 224 separate the forward and reverse signals that travel on the same electrical path at the ports 202, 204. The first diplex filter 222 separates and passes the forward signals 206 received on the first port 202 for amplification by the forward gain stage 242, and the second diplex filter 224 separates and passes the reverse signals 208 received on the second port 204 for amplification by the reverse gain stage 244. The diplex filters and gain stages may be implemented using known circuit components in RF amplifiers. The RF amplifier 200 may also include other circuit components (not shown) such as attenuators, equalizers, highpass filters, lowpass filters, system trim circuits, and reverse 6 dB switching circuits.

In this embodiment, an automatic gain control (AGC) system 250 is coupled to at least the forward gain stage 242 that amplifies the downstream RF signal 206. The AGC system 250 provides automatic gain control (AGC) and/or automatic level/slope control (ALSC) based on selected pilot channels in the downstream RF signal 206. AGC or ALSC is used to maintain stable RF output levels of the amplifier gain stage 242 as RF input levels vary, for example, due to temperature induced changes and coaxial and passive losses. As will be described in greater detail below, the AGC system 250 uses a wideband RF tuner 252 to select multiple pilot channels (also referred to as test channels) from a sample of the downstream or forward RF signal 206 and determines the appropriate gain and/or tilt compensation. The AGC system 250 may take the sample of the downstream RF signal 206 at the input, immediate stage, output or any other location within the controlled RF amplifier 200.

Figure 3:
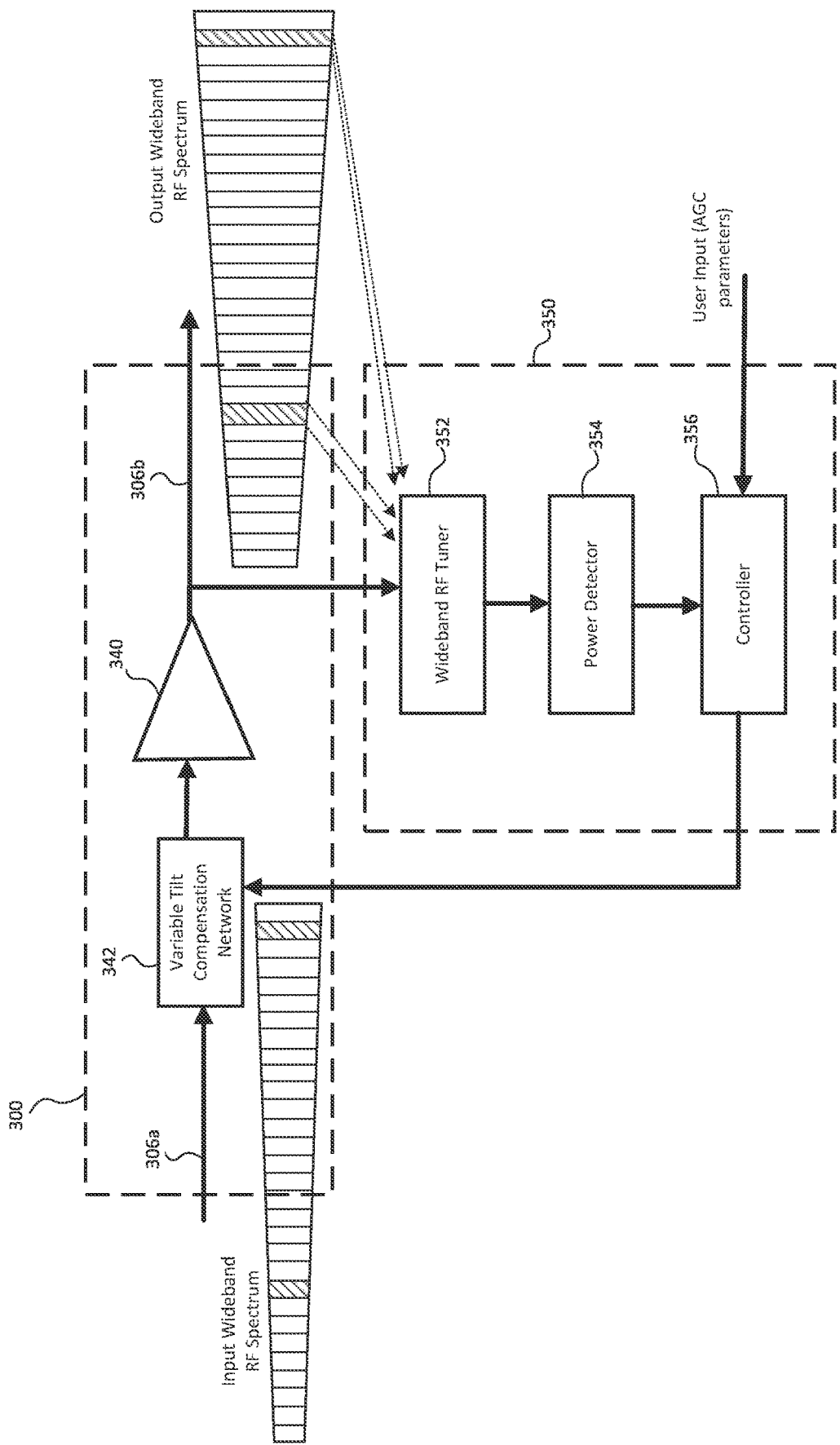
FIG. 3 is a schematic diagram of an embodiment of an adjustable AGC system including a wideband RF tuner to select pilot channels and a power detector circuit to measure power of the selected pilot channels.

Referring to FIG. 3, an embodiment of an amplifier circuit 300 and an AGC system 350 is shown in greater detail. The amplifier circuit 300 is configured to receive an input downstream RF signal 306a and to amplify the input downstream RF signal 306a to provide an amplified output downstream RF signal 306b. In one example, the operational gain at 1794 MHz may be in the 46 to 50 dB range. In this embodiment, the amplifier circuit 300 includes a gain stage 340 to provide amplification across the wideband RF spectrum and a variable tilt compensation network 342 to provide tilt compensation across the wideband RF spectrum. The variable tilt compensation network 342 may include attenuators and/or equalizers as known to those of ordinary skill in the art for use in AGC and/or ALSC, for example, to correct for frequency response movement over temperature. The attenuators may include, for example, a variable attenuator, such as an adjustable pad that has a flat response. The equalizers may include a variable equalizer that has a tilted response, such as a flat or linear tilted response or a bowed or cable tilted response.

The AGC system 350 includes a wideband RF tuner 352, a power detector circuit 354, and a controller 356 such as a microcontroller. The wide band RF tuner 352 may include a commercially available terrestrial TV tuner, such as the Si2141 tuner available from Skyworks Solutions, Inc. or the MXL608 tuner available from MaxLinear, Inc. The wideband RF tuner 352 receives a portion or sample of the downstream RF signal 306a, 306b and selects the pilot channels for use in AGC. Although the illustrated embodiment shows the sample taken at the output, the sample of the downstream RF signal 306a, 306b may be taken at the input, immediate stage, output or any other location within the controller RF amplifier. In one example, the wideband RF tuner circuit 352 selects a first pilot channel in a lower portion of the frequency range of the RF spectrum (i.e., lower pilot channel) and a second pilot channel in an upper portion of the frequency range of the RF spectrum (i.e., upper pilot channel). In an embodiment of a 1.8 GHz RF amplifier where the forward band or RF spectrum frequency range is 54 MHz to 1.8 GHz, for example, the lower pilot channel may be below 750 MHz and the upper pilot channel may be above 1.2 GHz. In an embodiment of a 1.2 GHz RF amplifier where the forward band is 54 MHz to 1.2 GHz, the lower pilot channel may be below 500 MHz and the upper pilot channel may be above 700 MHz.

The wideband RF tuner 352 pilot channels may be selected based on amplifier configuration or user input. For example, the number and/or location of the pilot channels can be set depending on the operating frequency range of the amplifier or set to particular customer defined locations. This flexibility in the location of the wideband tuner pilot channels allows the AGC operation to be adjusted as the forward bandwidth changes. In some embodiments, a lower pilot channel or frequency may be a legacy pilot channel and an upper pilot channel of frequency may be the highest channel utilized. Selecting more than two pilot channels and/or selecting pilot channels across a wider range of frequencies may allow more accurate tilt compensation, for example, to compensate for the non-linear tilt in a coaxial cable.

The power detector circuit 354 provides a detector voltage derived from the signal level of the selected pilot channels selected by the wideband tuner and passed to it. Where multiple pilot channels are used, the power detector circuit 354 measures the power of each channel separately and generates the detector voltage for each. The power detector circuit 354 may include known power detector circuits such as the LMH2110 available from TI or the LT5537 available from Linear Technologies.

The controller 356 receives the individual pilot channel power measurements made by the power detector circuit 354 and determines the required amplifier correction based on those measurements and/or user input. The controller 356 then generates the required control voltage or voltages to be applied to the amplifier circuit 300 for AGC purposes. The amplifier circuit 300 gain and/or tilt is adjusted in response to the control voltage or voltages to achieve the amplifier correction. The controller 356 may include a microcontroller, such as the STM32G0B1RCT6 available from ST Microelectronics. The controller 356 may be capable of receiving user input including AGC parameters such as target gain and target tilt.

To adjust tilt, the controller 356 may sense the response level change at various frequencies (e.g., multiple pilot channels) and adjust the variable attenuators and/or equalizers that compensate for the tilt (e.g. to achieve the target tilt set by the user). The user may access the controller 356 (e.g., through application software) and instruct the controller 356 to change the variable attenuators and/or equalizers as needed. If a user looks at an input test point in the RF amplifier, for example, and determines that an attenuator and/or equalizer needs to be adjusted, the user may access the controller 356 to make that adjustment. The user may also instruct the controller 356 to set the amplifier to a predetermined configuration and the controller 356 will follow an algorithm to accomplish the user configuration.

Figure 4:
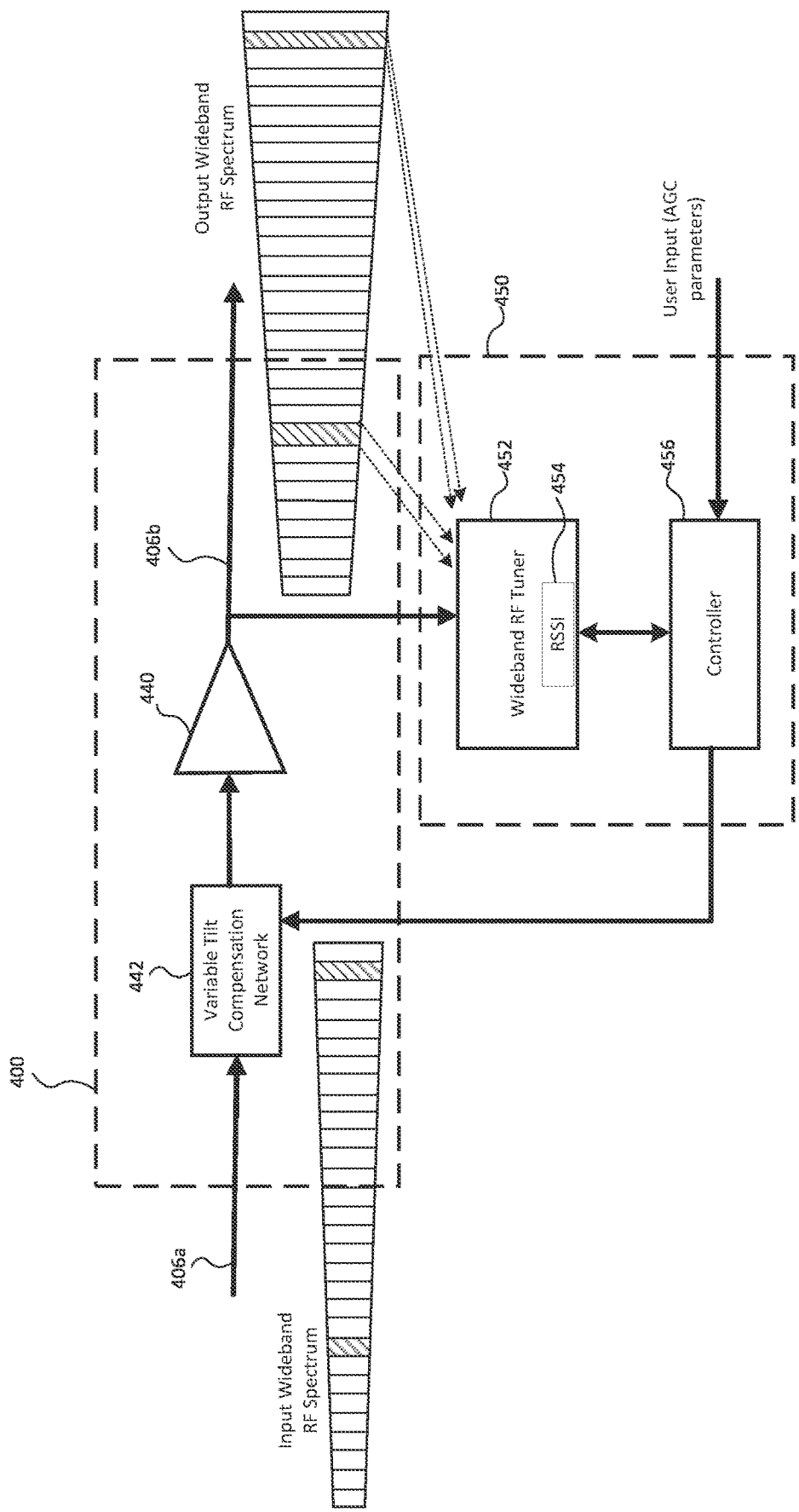
FIG. 4 is a schematic diagram of another embodiment of an adjustable AGC system including a wideband RF tuner to select pilot channels and using RSSI to measure power of the selected pilot channels.

Referring to FIG. 4, another embodiment of an amplifier circuit 400 and AGC system 450 is shown and described in greater detail. Similar to the embodiment described above, the amplifier circuit 400 includes a gain stage 440 to provide gain and a variable tilt compensation network 442 to provide tilt compensation across the wideband RF spectrum. In this embodiment, the AGC system 450 also includes a wideband RF tuner 452 to select the pilot channels, but an RSSI (received signal strength indication) signal 454 from the wideband RF tuner 452 is used, instead of the power detector circuit, to provide an indication of the signal level of the selected pilot channels. A controller 456, such as a microcontroller, may then generate an AGC control voltage or voltages derived from the RSSI signals 454 of each tuned pilot channel for adjusting the gain and/or tilt in the amplifier circuit 400. In this embodiment, the controller 456 or a separate RSSI monitoring circuit may be configured to receive the RSSI signal 454.

In both embodiments, the AGC system 350, 450 may also be configured to prevent a loss of RF signal at a selected pilot channel from causing an AGC to rail the amplifier to a full gain condition. For example, the wideband RF tuner 352, 452 may be configured to select a different pilot channel, if a loss of signal is detected at the previously selected pilot channel. If first and second pilot channels in lower and upper frequency ranges are used, the different pilot channel may be selected in the respective lower and upper frequency ranges. In other embodiments, the AGC system 350, 450 may be configured to revert to a thermistor-based type gain control where the gain is adjusted in response to a thermal measurement. In another embodiment, the AGC system 350, 450 may be configured to lock the gain settings to the level or state prior to the loss of the RF signal at the selected pilot channel.

In some embodiments, the wideband RF tuner (e.g., a terrestrial TV tuner) may not be capable of selecting pilot channels at the higher forward band frequencies supported by the RF amplifier. Some TV tuners, for example, may only work up to 1.0 GHz, where newer RF amplifiers operate with a forward band up to 1.8 GHz. In these embodiments, the AGC system may also include a block conversion circuit to shift the higher frequencies down to lower frequencies that are in the range of the wideband tuner, as will be described in greater detail below.

Figure 5:
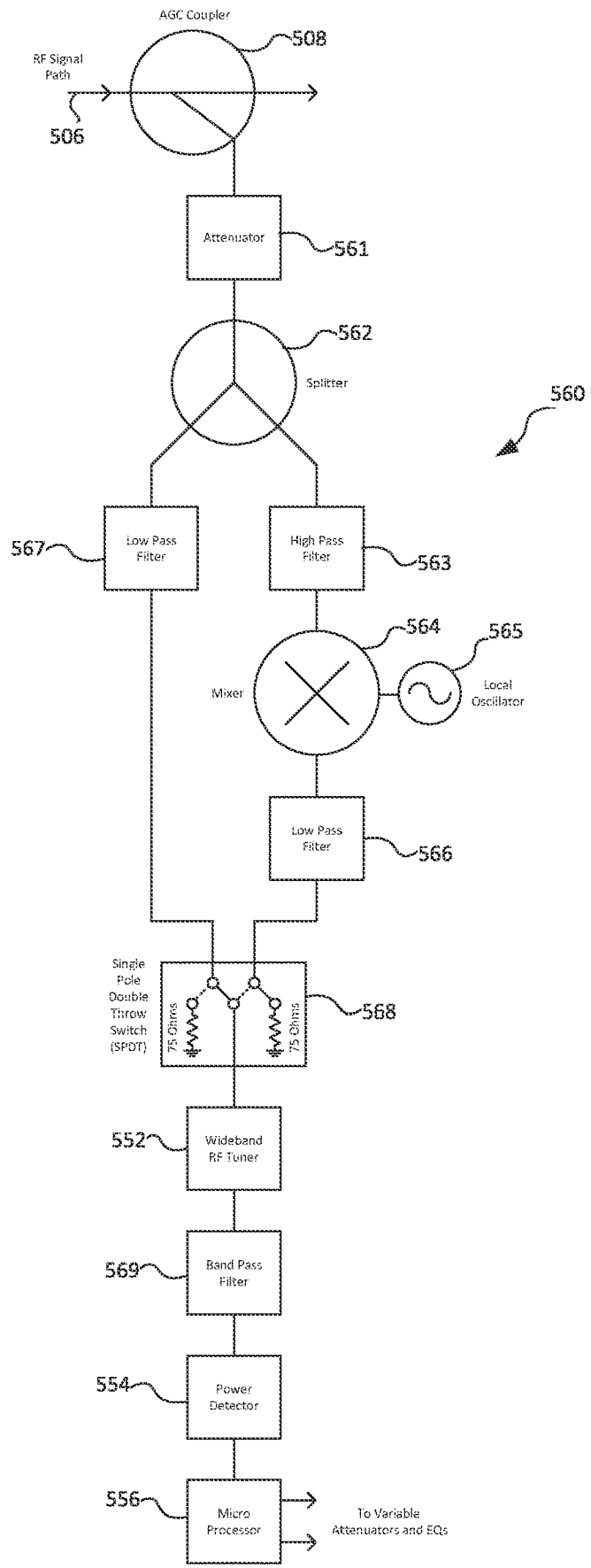
FIG. 5 is a schematic diagram of an embodiment of an adjustable AGC system including a wideband RF tuner for selecting pilot channels in lower and upper portions of the frequency spectrum and block conversion circuitry for shifting the higher frequencies in the upper portion of the frequency spectrum to the range of the RF tuner.
Figure 6:
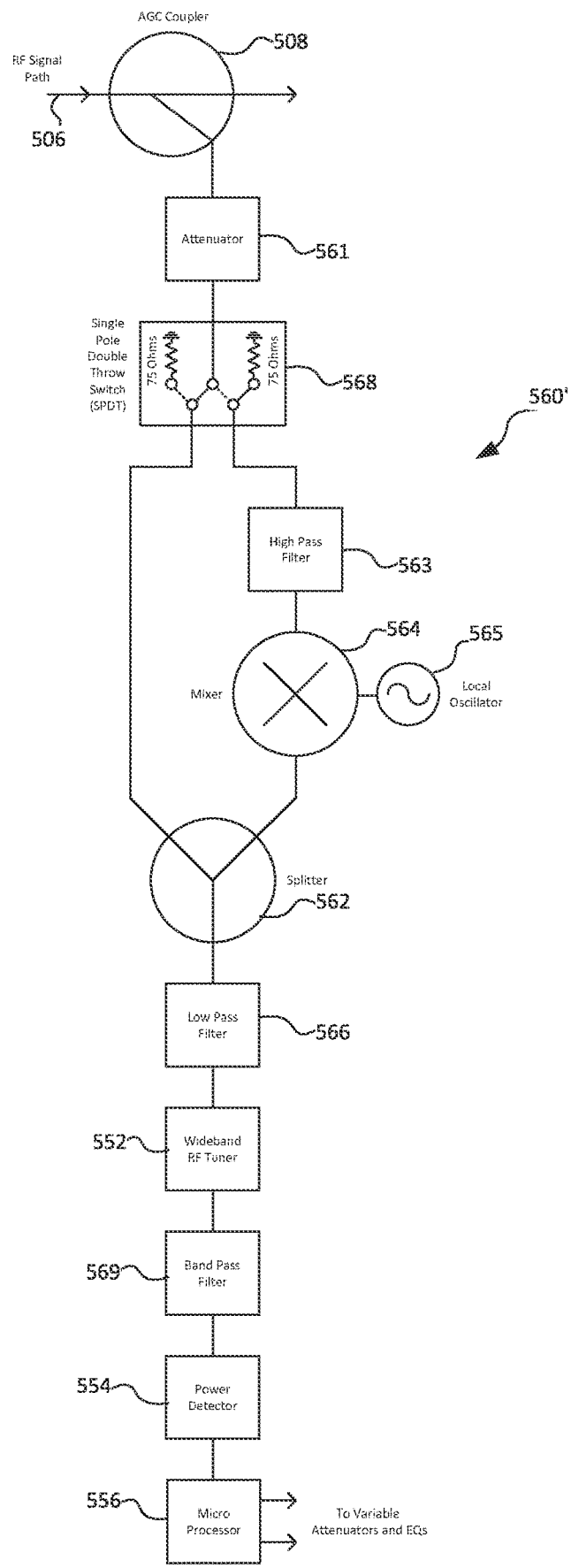
FIG. 6 is a schematic diagram of another embodiment of an adjustable AGC system including a wideband RF tuner for selecting pilot channels in lower and upper portions of the frequency spectrum and block conversion circuitry for shifting the higher frequencies in the upper portion of the frequency spectrum to the range of the RF tuner.
Figure 7:
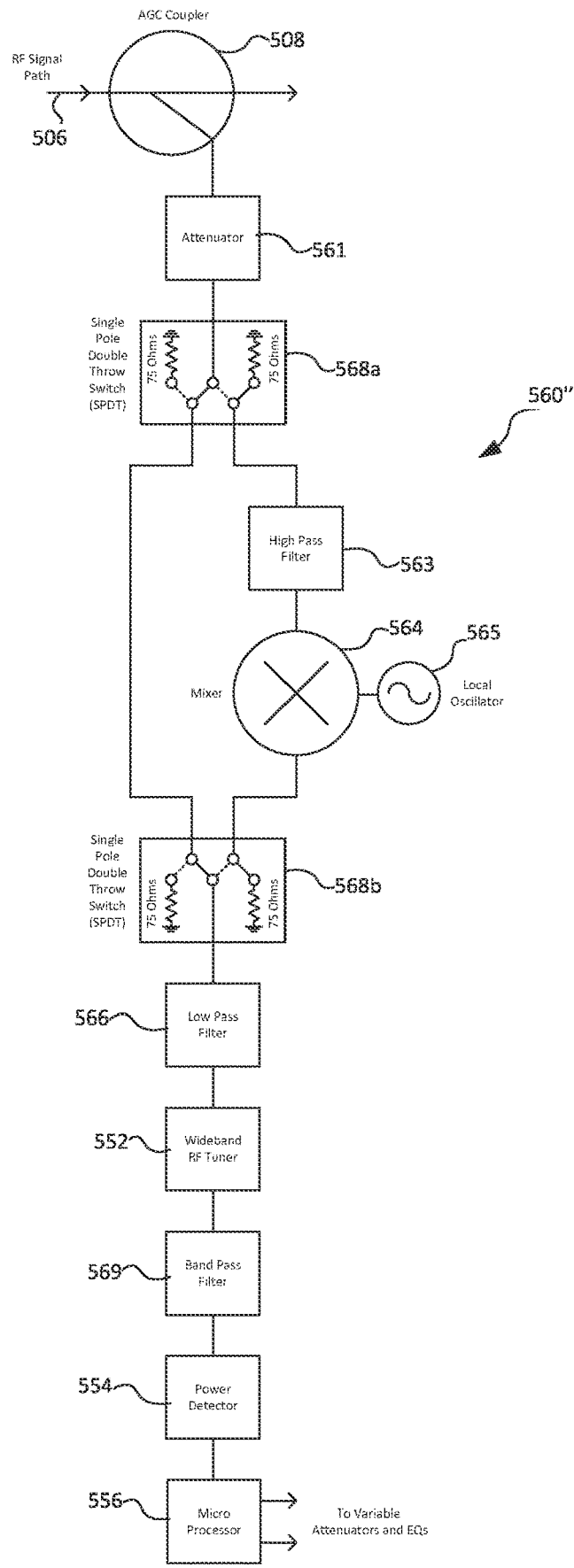
FIG. 7 is a schematic diagram of a further embodiment of an adjustable AGC system including a wideband RF tuner for selecting pilot channels in lower and upper portions of the frequency spectrum and block conversion circuitry for shifting the higher frequencies in the upper portion of the frequency spectrum to the range of the RF tuner.

FIGS. 5-7 illustrate different embodiments a block conversion circuit 560, 560', 560" that may be used in an AGC system, as described above. In the illustrated embodiments, similar to FIG. 3 discussed above, the AGC system includes a wideband RF tuner 552 to select the pilot channels, a power detector 554 to measure the power of the selected pilot channels, and a controller 556 (e.g., microprocessor) to provide the AGC control signal to the amplifier circuitry (e.g., to the variable attenuators and equalizers).

As shown in FIG. 5, an AGC coupler 508 may be used to direct a sample of the RF signal 506 into the AGC circuit. An attenuator 561 may be used to attenuate the sampled RF signal, and a splitter 562 divides the sampled RF signal and routes the sampled RF signal to low and high frequency paths. The low frequency path includes a low pass filter 567 and passes RF signals within the range of the wideband RF tuner 552. The high frequency path includes a high pass filter to pass the RF signals at the high frequencies outside the range of the RF tuner 552. The high frequency path block converts those RF signals above the tuning range of the RF tuner 552 to lower frequencies within the range of the wideband RF tuner 552 using a mixer 564 coupled to a local oscillator 565 followed by a low pass filter 566.

A switch 568, such as a single pole double throw (SPDT) switch, selects which of the two paths is routed to the wideband RF tuner 552 at any one time. The wideband RF tuner 552 selects a particular pilot channel and converts the pilot channel to an intermediate frequency (IF) channel, which is filtered by a band pass filter 569 and sent to the power detector 554. The power detector 554 measures the level of the IF channel and outputs a voltage representing that level. This process may be repeated at various points throughout the RF signal band to select additional pilot channels. The controller 556 then uses the power level information from the power detector 554 and other information programmed into the controller 556 to determine the correction needed in the amplifier circuitry, for example to determine which variable attenuators and/or equalizers to adjust and by how much.

The embodiment of the block conversion circuit 560' shown in FIG. 6 is similar to FIG. 5, but the locations of the splitter 562 and switch 568 have been reversed to improve path isolation and provide better terminations within the circuit. The low pass filter 566 is also moved to the common signal path following the splitter 562 to eliminate the need for multiple low pass filters. The embodiment of the block conversion circuit 560" shown in FIG. 7 is similar to FIG. 6 but uses a second switch 568b (e.g., SPDT switch) instead of the splitter, which provides even better path isolation.

Other variations of the block conversion circuit may also be used, if necessary, to shift the higher frequencies to the range of the wideband RF tuner. In other embodiments, the wideband RF tuner may be capable of selecting channels in the higher frequencies of the RF amplifier and the block conversion circuit may not be necessary.

Figure 8:
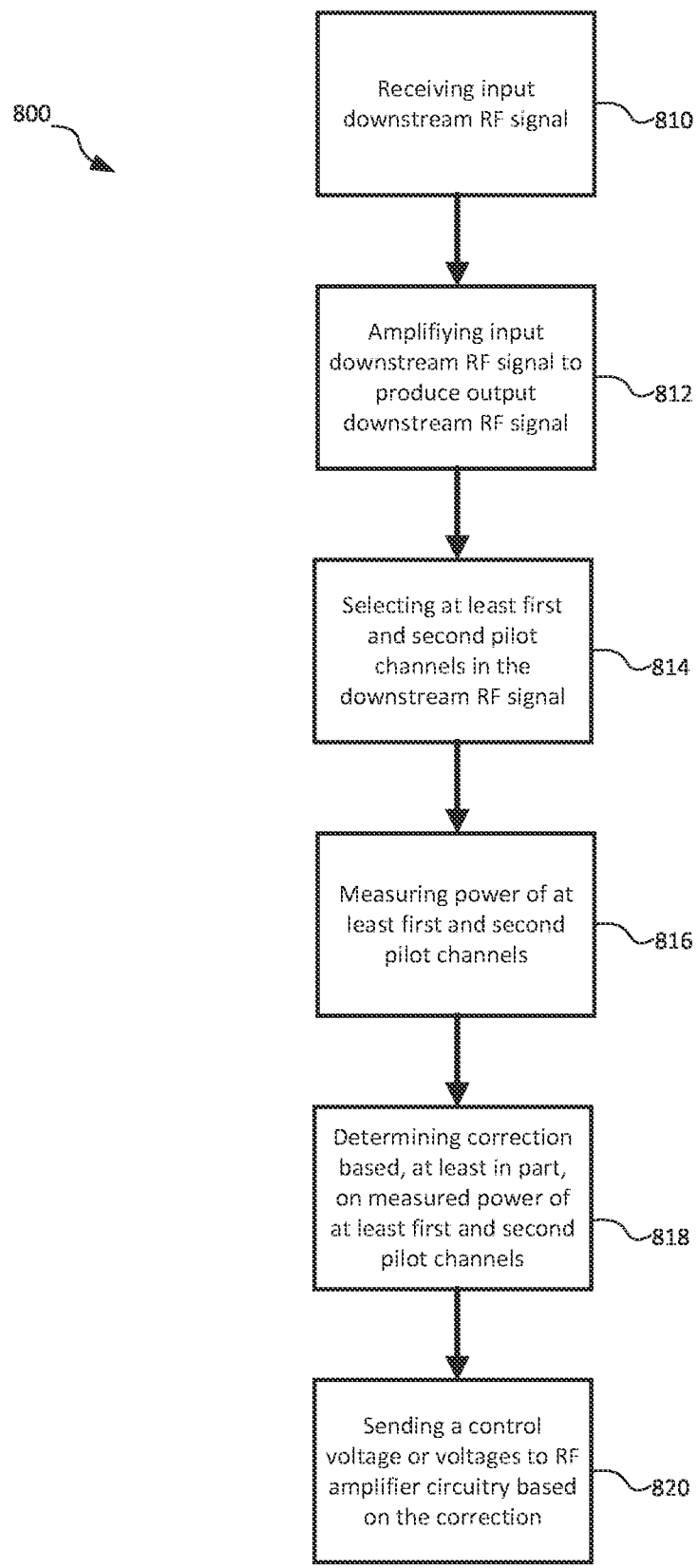
FIG. 8 is a flow chart illustrating one embodiment of a method for providing automatic gain control (AGC) of an RF amplifier by selecting pilot channels.

Referring to FIG. 8, a method 800 for providing automatic gain control of an RF amplifier in an HFC network, consistent with the present disclosure, is shown and described. This method may be performed using any embodiment of the AGC system described above. According to the method 800, an input downstream RF signal having a wideband RF spectrum (e.g., 1.8 GHz) is received 810 in an RF amplifier, such as a line extender RF amplifier in the HFC network. The input downstream RF signal is amplified 812 in the amplifier to produce an output downstream RF signal having the wideband RF spectrum. Amplifying the RF signal may include increasing the operational gain at 1794 MHz, for example, in a range of 46 to 50 dB.

At least first and second pilot channels in the downstream RF signal (e.g., lower and upper pilot channels) are selected 814 using a wideband RF tuner, as described above. Power of the at least first and second pilot channels is measured 816, for example, using a power detector circuit or an RSSI circuit in the wideband RF tuner. A correction is then determined 818 based, at least in part, on the measured power of the at least first and second pilot channels, and a control voltage (or voltages) is (are) sent 820 to the amplifier circuitry based on the correction (e.g., to the variable tilt compensation network and/or gain stage). The RF amplifier gain and/or tilt is adjusted in response to the control voltage or voltages determined from the measured power of the at least first and second selected pilot channels.

Accordingly, using a wideband RF tuner to select pilot channels for automatically controlling gain across a wideband RF spectrum (e.g., 1.8 GHz) avoids the need to re-space RF amplifiers in an HFC network and allows RF amplifiers in the HFC network, such as a CATV network, to maintain stable RF output levels as the RF amplifier performance and/or input levels vary, for example, due to temperature induced changes. The wideband RF tuner also enables an adjustable AGC system that facilitates user configuration and adjustment of the desired gain and/or tilt, for example, to account for changes in the forward frequency band of the RF signals and the non-linear frequency response of coaxial cables.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A controlled radio frequency (RF) amplifier for use in a hybrid fiber-coaxial (HFC) network, the controlled RF amplifier comprising:
   amplifier circuitry configured to receive an input downstream RF signal having a wideband spectrum and to amplify the input downstream RF signal to provide an output downstream RF signal having the wideband spectrum;
   automatic gain control (AGC) circuitry configured to control gain of the amplifier circuitry, the AGC circuitry comprising:
   a wideband RF tuner configured to receive a sample of the downstream RF signal from the amplifier circuitry and to select at least first and second pilot channels from the sample of the downstream RF signal;
   means for measuring power of the at least first and second pilot channels; and
   a controller configured to determine a correction based on the measured power of the at least first and second pilot channels and to provide a control voltage or voltages to the amplifier circuitry based on the correction.

2. The controlled RF amplifier of claim 1, wherein the wideband RF tuner is configured to receive a sample of the downstream RF signal at an output of the amplifier circuitry.

3. The controlled RF amplifier of claim 1, wherein the amplifier circuitry comprises a variable tilt compensation network, and wherein the correction includes a gain correction and a tilt compensation.

4. The controlled RF amplifier of claim 1, wherein the wideband RF tuner is configured to select the first channel in a lower portion of the wideband RF spectrum and to select the second channel in an upper portion of the wideband RF spectrum.

5. The controlled RF amplifier of claim 4, wherein the controlled RF amplifier is configured to amplify the downstream RF signal at frequencies up to 1.8 GHz, and wherein the first pilot channel is below 750 MHz and the second pilot channel is above 1.2 GHz.

6. The controlled RF amplifier of claim 4, wherein the wideband RF spectrum of the downstream RF signal is up to 1.2 GHz, and wherein the first pilot channel is below 500 MHz and the second pilot channel is above 700 MHz.

7. The controlled RF amplifier of claim 1, wherein the controlled RF amplifier is a line extender amplifier configured to be located on a feeder line of the HFC network.

8. The controlled RF amplifier of claim 1, wherein the controlled RF amplifier supports DOCSIS 4.0 FDD (Frequency Division Duplex) capabilities.

9. The controlled RF amplifier of claim 1, wherein the means for measuring power includes the wideband RF tuner providing a received signal strength indicator (RSSI) indicative of the power.

10. The controlled RF amplifier of claim 1, wherein the means for measuring power includes a power detector circuit after the wideband RF tuner.

11. The controlled RF amplifier of claim 1, wherein the wideband RF tuner is configured to select the at least first and second pilot channels in response to user input.

12. The controlled RF amplifier of claim 1, wherein the wideband RF tuner is configured to receive a user selection of a number and location of the pilot channels.

13. The controlled RF amplifier of claim 1, wherein the microcontroller is configured to receive automatic gain control parameters.

14. The controlled RF amplifier of claim 1 wherein the wideband RF tuner is a terrestrial TV tuner, and wherein the AGC circuit further includes a block conversion circuit configured to convert higher frequencies of the downstream RF signal down to lower frequencies within a range of the terrestrial TV tuner.

15. An automatic gain control (AGC) system for controlling gain in an RF line extender amplifier in a hybrid fiber-coaxial (HFC) network, the AGC system comprising:
a wideband RF tuner configured to receive an output downstream RF signal from the RF amplifier and to select at least first and second pilot channels from a sample of the downstream RF signal, wherein the downstream RF signal has a wideband spectrum of up to 1.8 GHz, wherein the first channel is located in a lower frequency range of the wideband spectrum, and wherein the second channel is located in an upper frequency range of the wideband spectrum;
a power detector circuit for measuring power of the selected at least first and second pilot channels; and
a controller configured to determine a correction based on the measured power of the at least first and second pilot channels and to provide a control voltage or voltages to RF amplifier based on the correction for automatic gain control.

16. The AGC system of claim 15 wherein the wideband RF tuner is a terrestrial TV tuner, and further including a block conversion circuit configured to convert higher frequencies of the downstream RF signal down to lower frequencies within a range of the terrestrial TV tuner.

17. A method for providing automatic gain control (AGC) of a radio frequency (RF) amplifier in a hybrid fiber-coaxial (HFC) network, the method comprising:
receiving an input downstream RF signal having a wideband RF spectrum in the RF amplifier;
amplifying the input downstream RF signal using RF amplifier circuitry to produce an output downstream RF signal having the wideband RF spectrum;
selecting at least first and second pilot channels in a sample of the downstream RF signal having the wideband spectrum at a location in the RF amplifier, wherein selecting the pilot channels is performed using a wideband RF tuner;
measuring power of the at least first and second pilot channels;
determining a correction based, at least in part, on the measured power of the first and second pilot channels; and
sending a control voltage or voltages to the RF amplifier circuitry based on the correction.

18. The method of claim 17 wherein the correction includes a gain correction and a tilt compensation.

19. The method of claim 17 wherein the first channel is located in a lower portion of the wideband RF spectrum, and wherein the second channel is located in an upper portion of the wideband RF spectrum.

20. The method of claim 19 wherein the wideband RF spectrum of the downstream RF signal is up to 1.8 GHz, and wherein the first pilot channel is below 750 MHz and the second pilot channel is above 1.2 GHz.

21. The method of claim 19 wherein the wideband RF spectrum of the downstream RF signal is up to 1.2 GHz, and wherein the first pilot channel is below 500 MHz and the second pilot channel is above 700 MHz.

22. The method of claim 17 wherein the power is measured using a power detector circuit located after the wideband tuner.

23. The method of claim 17 further comprising receiving a user selection of at least one of the first and second channels.

24. The method of claim 17 further comprising receiving a user selection of a number and location of the pilot channels.

25. The method of claim 17 further comprising receiving user input of at least one automatic gain control parameter selected from the group consisting of target gain and target tilt.

* * * * *